(12) United States Patent
Matsumoto et al.

(10) Patent No.: US 10,815,369 B2
(45) Date of Patent: Oct. 27, 2020

(54) COMPOSITION AND MOLDED ARTICLE

(71) Applicants: AKITA UNIVERSITY, Akita-shi, Akita (JP); DAIKIN INDUSTRIES, LTD., Osaka-shi, Osaka (JP)

(72) Inventors: Kazuya Matsumoto, Akita (JP); Mitsutoshi Jikei, Akita (JP); Sumito Yamakawa, Akita (JP); Tadatake Sakurada, Akita (JP); Fumihiro Kamiya, Osaka (JP); Tsuyoshi Noguchi, Osaka (JP)

(73) Assignees: Akita University, Akita (JP); DAIKIN INDUSTRIES, LTD., Osaka (JP)

( * ) Notice: Subject to any disclaimer, the term of this patent is extended or adjusted under 35 U.S.C. 154(b) by 89 days.

(21) Appl. No.: 16/324,186

(22) PCT Filed: Aug. 8, 2017

(86) PCT No.: PCT/JP2017/028820
§ 371 (c)(1),
(2) Date: Feb. 8, 2019

(87) PCT Pub. No.: WO2018/030427
PCT Pub. Date: Feb. 15, 2018

(65) Prior Publication Data
US 2019/0169415 A1 Jun. 6, 2019

(30) Foreign Application Priority Data
Aug. 10, 2016 (JP) .................................. 2016-157880

(51) Int. Cl.
| | | |
|---|---|---|
| *C08L 27/18* | (2006.01) | |
| *C08L 27/12* | (2006.01) | |
| *C08L 77/00* | (2006.01) | |
| *C09K 3/10* | (2006.01) | |
| *H01J 37/32* | (2006.01) | |
| *H01L 21/67* | (2006.01) | |

(52) U.S. Cl.
CPC ............... *C08L 27/18* (2013.01); *C08L 27/12* (2013.01); *C08L 77/00* (2013.01); *C09K 3/1009* (2013.01); *H01J 37/32513* (2013.01); *H01L 21/67069* (2013.01); *C08L 2312/00* (2013.01); *C09K 2200/0637* (2013.01); *C09K 2200/0685* (2013.01)

(58) Field of Classification Search
CPC .......... C08L 27/12; C08L 27/14; C08L 27/16; C08L 27/18; C08L 27/20; C08F 4/18; C09K 3/1009; C07F 7/21; C08K 5/5435
See application file for complete search history.

(56) References Cited

U.S. PATENT DOCUMENTS

| | | |
|---|---|---|
| 5,187,222 A | 2/1993 | Abe et al. |
| 6,642,300 B1 | 11/2003 | Kawaguchi et al. |
| 7,193,015 B1 | 3/2007 | Mabry et al. |
| 2003/0045623 A1 | 3/2003 | Higashino et al. |
| 2006/0235140 A1 | 10/2006 | Tanaka et al. |
| 2010/0286327 A1 | 11/2010 | Moorlag et al. |
| 2010/0317787 A1 | 12/2010 | Baghdachi et al. |
| 2012/0257914 A1* | 10/2012 | Moorlag .............. C08G 77/045 399/333 |
| 2018/0030246 A1 | 2/2018 | Matsumoto et al. |

FOREIGN PATENT DOCUMENTS

| | | |
|---|---|---|
| EP | 3 260 490 A1 | 12/2017 |
| JP | 2-219848 A | 9/1990 |
| JP | 6-302527 A | 10/1994 |
| JP | 2010-262290 A | 11/2010 |
| WO | 00/064980 A1 | 11/2000 |
| WO | 01/32782 A1 | 5/2001 |
| WO | 2004/094527 A1 | 11/2004 |
| WO | 2016/133108 A1 | 8/2016 |

OTHER PUBLICATIONS

Matsumoto et al., "Synthesis and properties on aromatic polyamide dendrimers with polyhedral oligomeric silsesquioxane cores", Polymer Chemistry, vol. 6, 2015, pp. 4758-4765.

* cited by examiner

*Primary Examiner* — Kuo Liang Peng
(74) *Attorney, Agent, or Firm* — Sughrue Mion, PLLC

(57) ABSTRACT

The invention provides a composition capable of providing a molded article that has excellent heat resistance and a small weight change against oxygen plasma exposure and fluorine plasma exposure during a semiconductor manufacturing step. The composition contains a fluorine-containing polymer and a hyperbranched polymer of a cage silsesquioxane with a specific structure.

9 Claims, No Drawings

COMPOSITION AND MOLDED ARTICLE

CROSS REFERENCE TO RELATED APPLICATIONS

This application is a National Stage of International Application No. PCT/JP2017/028820, filed on Aug. 8, 2017, which claims priority from Japanese Patent Application No. 2016-157880, filed on Aug. 10, 2016.

TECHNICAL FIELD

The invention relates to compositions containing a fluorine-containing polymer, and molded articles obtainable therefrom.

BACKGROUND ART

Fluoroelastomers, especially perfluoroelastomers containing a tetrafluoroethylene (TFE) unit, have excellent chemical resistance, solvent resistance, and heat resistance. They are therefore widely used as components such as sealants in severe environments in the aerospace field, the semiconductor equipment field, the chemical plant field, and the like.

Addition of filler to fluorine-containing elastomers is a known technique to improve characteristics that sealants need to have.

In order to provide a semiconductor equipment sealant having heat resistance, low gas permeability, and stability even against plasma irradiation in an oxygen or $CF_4$ atmosphere, and generating no dust, Patent Literature 1 proposes adding 1 to 50 parts by weight of silica and 1 to 10 parts by weight of an organic peroxide to 100 parts by weight of a fluoroelastomer.

In order to improve the plasma resistance and to reduce generation of particles after plasma irradiation, Patent Literature 2 proposes adding aluminum oxide fine particles having an average particle size of not greater than 0.5 µm to a crosslinkable fluoroelastomer component.

In order to provide a white pigment-containing composition of a peroxide-vulcanizable fluorine-containing elastomer that does not impair the residual compression set, Patent Literature 3 proposes adding ultrafine white carbon particles used in the form of 4 to 5 wt % aqueous solution with a pH of 9 to 12 to a fluorine-containing elastomer.

In order to provide a fluorine-containing elastomer composition capable of maintaining the heat resistance and the processability in an environment involving direct plasma exposure, such as the inside of a dry etching device, having a small weight change against both fluorine plasma exposure and oxygen plasma exposure during a semiconductor manufacturing step, and generating no foreign substances (particles) in these treatments, Patent Literature 4 proposes adding, to a fluorine-containing elastomer, at least one selected from the group consisting of isoindolinone pigments, quinacridone pigments, diketopyrrolopyrrole pigments, anthraquinone pigments, amine antioxidants, phenol antioxidants, sulfur antioxidants, and phosphorus antioxidants.

Patent Literature 5 discloses a filler which has a small weight change against both oxygen plasma irradiation and $CF_4$ plasma irradiation and which is formed from a synthetic polymer compound containing an amide bond in the main chain or a synthetic polymer compound containing an imide bond. This literature also discloses blending of the filler to a crosslinkable elastomer.

CITATION LIST

Patent Literature

Patent Literature 1: JP H06-302527 A
Patent Literature 2: WO 01/032782
Patent Literature 3: JP H02-219848 A
Patent Literature 4: WO 2004/094527
Patent Literature 5: WO 00/64980

SUMMARY OF INVENTION

Technical Problem

There is still a demand for a technique applicable to further miniaturization of semiconductor devices.

In response to the above issue, the invention aims to provide a composition capable of providing a molded article having excellent heat resistance and a small weight change against oxygen plasma exposure and fluorine plasma exposure during a semiconductor manufacturing step, and a molded article having excellent heat resistance and a small weight change against both oxygen plasma exposure and fluorine plasma exposure during a semiconductor manufacturing step.

Solution to Problem

The inventors performed studies to find that use of a hyperbranched polymer of a silsesquioxane with a specific structure as a filler provides a molded article having excellent heat resistance and a small weight change against oxygen plasma exposure and fluorine plasma exposure during a semiconductor manufacturing step.

In other words, the invention relates to a composition containing a fluorine-containing polymer and a hyperbranched polymer of a cage silsesquioxane represented by the following formula (1).

The formula (1) is as follows:

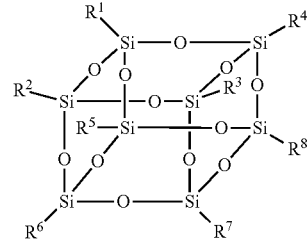

[Chem. 1]

wherein $R^1$ to $R^6$ are each individually a hydrogen atom, a halogen atom, or an organic group, and at least one of $R^1$ to $R^8$ is an organic group.

The hyperbranched polymer of a cage silsesquioxane preferably has a molecular weight distribution.

In the formula (1), $R^1$ to $R^8$ each preferably individually contain a terminal group T represented by the following formula (2).

The formula (2) is as follows:

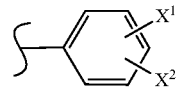

[Chem. 2]

wherein $X^1$ and $X^2$ are each individually —$NH_2$, —OH, —SH, —H, —NH—CO—$CF_3$, or a group represented by the following formula:

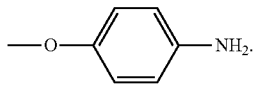

[Chem. 3]

In the formula (1), $R^1$ to $R^6$ preferably contain a divalent group B1 represented by the following formula (3-1).
The formula (3-1) is as follows.

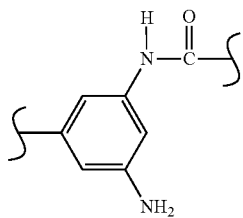

[Chem. 4]

The fluorine-containing polymer is preferably a fluorine-containing elastomer.

The composition of the invention preferably contains 0.5 to 100 parts by mass of the hyperbranched polymer of a cage silsesquioxane relative to 100 parts by mass of the fluorine-containing polymer.

The composition of the invention preferably further contains a cross-linking agent.

The composition of the invention is preferably a molding material.

The invention also relates to a molded article obtainable from the above composition.

Advantageous Effects of Invention

The composition of the invention has the aforementioned structure, and thus a molded article obtainable from the composition of the invention has excellent heat resistance and a small weight change against oxygen plasma exposure and fluorine plasma exposure during a semiconductor manufacturing step.

The molded article of the invention has the aforementioned structure, and thus the molded article has excellent heat resistance and a small weight change against oxygen plasma exposure and fluorine plasma exposure during a semiconductor manufacturing step.

DESCRIPTION OF EMBODIMENTS

The invention will be specifically described hereinbelow.
The composition of the invention contains a fluorine-containing polymer and a hyperbranched polymer of a cage silsesquioxane with a specific structure.

In order to achieve excellent scalability, chemical resistance, and heat resistance, the fluorine-containing polymer is preferably a fluorine-containing elastomer.

The fluorine-containing elastomer may be either a partially fluorinated elastomer or a perfluoroelastomer. In order to achieve better chemical resistance and heat resistance, a perfluoroelastomer is preferred.

Examples of the partially fluorinated elastomer include vinylidene fluoride (VdF) fluororubber, tetrafluoroethylene (TFE)/propylene (Pr) fluororubber, tetrafluoroethylene (TFE)/propylene/vinylidene fluoride (VdF) fluororubber, ethylene/hexafluoropropylene (HFP) fluororubber, ethylene/hexafluoropropylene (HFP)/vinylidene fluoride (VdF) fluororubber, and ethylene/hexafluoropropylene (HFP)/tetrafluoroethylene (TFE) fluororubber. Preferred is at least one selected from the group consisting of vinylidene fluoride fluororubber and tetrafluoroethylene/propylene fluororubber.

The vinylidene fluoride fluororubber is preferably a copolymer including 45 to 85 mol % of vinylidene fluoride and 55 to 15 mol % of at least one different monomer copolymerizable with vinylidene fluoride. It is preferably a copolymer including 50 to 80 mol % of vinylidene fluoride and 50 to 20 mol % of at least one different monomer copolymerizable with vinylidene fluoride.

In the present description, the amount of each monomer constituting the fluoropolymer can be calculated by any appropriate combination of NMR, FT-IR, elemental analysis, and X-ray fluorescence analysis in accordance with the type of the monomer.

Examples of the at least one different monomer copolymerizable with vinylidene fluoride include monomers such as tetrafluoroethylene (TFE), hexafluoropropylene (HFP), fluoroalkyl vinyl ethers, chlorotrifluoroethylene (CTFE), trifluoroethylene, trifluoropropylene, pentafluoropropylene, trifluorobutene, tetrafluoroisobutene, hexafluoroisobutene, vinyl fluoride, fluoromonomers represented by the formula (6): $CH_2$=$CRRf^{61}$ (wherein $Rf^{61}$ is a C1-C12 linear or branched fluoroalkyl group), fluoromonomers represented by the formula (7): $CH_2$=$CH$—$(CF_2)_n$—$X^2$ (wherein $X^2$ is H or F; and n is an integer of 3 to 10), and monomers giving a crosslinking site; and non-fluorinated monomers such as ethylene, propylene, and alkyl vinyl ethers. These may be used alone or in any combination. Preferred is at least one selected from the group consisting of TFE, HFP, fluoroalkyl vinyl ethers, and CTFE.

The fluoroalkyl vinyl ethers preferably include at least one selected from the group consisting of:
fluoromonomers represented by the following formula (8):

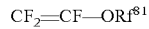

$CF_2$=$CF$—$ORf^{81}$ wherein $Rf^{81}$ is a C1-C8 perfluoroalkyl group;
fluoromonomers represented by the following formula (10):

$CF_2$=$CFOCF_2ORf^{101}$ wherein $Rf^{101}$ is a C1-C6 linear or branched perfluoroalkyl group, a C5-C6 cyclic perfluoroalkyl group, or a C2-C6 linear or branched perfluorooxyalkyl group containing 1 to 3 oxygen atom(s); and
fluoromonomers represented by the following formula (11):

$CF_2$=$CFO(CF_2CF(Y^{11})O)_m(CF_2)_nF$ wherein $Y^{11}$ is a fluorine atom or a trifluoromethyl group; m is an integer of 1 to 4; and n is an integer of 1 to 4, more preferably fluoromonomers represented by the formula (8).

Specific examples of the vinylidene fluoride fluororubber include VdF/HFP rubber, VdF/HFP/TFE rubber, VdF/CTFE rubber, VdF/CTFE/TFE rubber, rubber of VDF and a fluoromonomer of the formula (6), rubber of VDF, a fluoromonomer of the formula (6), and TFE, VDF/perfluoro(methyl vinyl ether) (PMVE) rubber, VDF/PMVE/TFE rubber, and VDF/PMVE/TFE/HFP rubber. The rubber of VDF and a fluoromonomer of the formula (6) is preferably VDF/CH$_2$=CFCF$_3$ rubber, and the rubber of VDF, a fluoromonomer of the formula (6), and TFE is preferably VDF/TFE/CH$_2$=CFCF$_3$ rubber.

The VDF/CH$_2$=CFCF$_3$ rubber is preferably a copolymer containing 40 to 99.5 mol % of VDF and 0.5 to 60 mol % of CH$_2$=CFCF$_3$, more preferably a copolymer containing 50 to 85 mol % of VDF and 15 to 50 mol % of CH$_2$=CFCF$_3$.

The tetrafluoroethylene/propylene fluororubber is preferably a copolymer containing 45 to 70 mol % of tetrafluoroethylene, 55 to 30 mol % of propylene, and 0 to 5 mol % of a fluoromonomer giving a crosslinking site.

The fluorine-containing elastomer may be a perfluoroelastomer. The perfluoroelastomer is preferably at least one selected from the group consisting of TFE-containing perfluoroelastomers, such as copolymers of TFE and a fluoromonomer of the formula (8), (10), or (11) and copolymers of TFE, a fluoromonomer of the formula (8), (10), or (11), and a monomer giving a crosslinking site.

In the case of a TFE/PMVE copolymer, the compositional ratio thereof is preferably (45 to 90)/(10 to 55) (mol %), more preferably (55 to 80)/(20 to 45), still more preferably (55 to 70)/(30 to 45).

In the case of a copolymer of TFE, PMVE, and a monomer giving a crosslinking site, the compositional ratio thereof is preferably (45 to 89.9)/(10 to 54.9)/(0.01 to 4) (mol %), more preferably (55 to 77.9)/(20 to 49.9)/(0.1 to 3.5), still more preferably (55 to 69.8)/(30 to 44.8)/(0.2 to 3).

In the case of a copolymer of TIE and a C4-C12 fluoromonomer of the formula (8), (10), or (11), the compositional ratio thereof is preferably (50 to 90)/(10 to 50) (mol %), more preferably (60 to 88)/(12 to 40), still more preferably (65 to 85)/(15 to 35).

In the case of a copolymer of TFE, a C4-C12 fluoromonomer of the formula (8), (10), or (11), and a monomer giving a crosslinking site, the compositional ratio thereof is preferably (50 to 89.9)/(10 to 49.9)/(0.01 to 4) (mol %), more preferably (60 to 87.9)/(12 to 39.9)/(0.1 to 3.5), still more preferably (65 to 84.8)/(15 to 34.8)/(0.2 to 3).

Copolymers having a compositional ratio outside the above range tend to lose the properties as an elastomer and to have properties similar to those of a resin.

The perfluoroelastomer is preferably at least one selected from the group consisting of copolymers of TFE, fluoromonomer of the formula (11), and a fluoromonomer giving a crosslinking site, copolymers of TFE and a perfluorovinyl ether of the formula (11), copolymers of TFE and a fluoromonomer of the formula (8), and copolymers of TFE, a fluoromonomer of the formula (8), and a monomer giving a crosslinking site.

The perfluoroelastomer may also be any of the perfluoroelastomers disclosed in patent documents such as WO 97/24381, JP S61-57324 B, JP H04-81608 B, and JP H05-13961 B.

The monomer giving a crosslinking site means a monomer (cure-site monomer) containing a crosslinkable group that gives a fluoropolymer a crosslinking site for forming crosslink by a cross-linking agent.

The monomer giving a crosslinking site is preferably at least one selected from the group consisting of: fluoromonomers represented by the following formula (12):

$$CX^3{}_2=CX^3-R_f^{121}CHR^{121}X^4$$

wherein $X^3$ is a hydrogen atom, a fluorine atom, or CH$_3$; $R_f^{121}$ is a fluoroalkylene group, a perfluoroalkylene group, a fluoro(poly)oxyalkylene group, or a perfluoro (poly)oxyalkylene group; $R^{121}$ is a hydrogen atom or CH$_3$; and $X^4$ is an iodine atom or a bromine atom;

fluoromonomers represented by the following formula (13):

$$CX^3{}_2=CX^3-R_f^{131}X^4$$

wherein $X^3$ is a hydrogen atom, a fluorine atom, or CH$_3$; $R_f^{131}$ is a fluoroalkylene group, a perfluoroalkylene group, a fluoropolyoxyalkylene group, or a perfluoropolyoxyalkylene group; and $X^4$ is an iodine atom or a bromine atom;

fluoromonomers represented by the following formula (14):

$$CF_2=CFO(CF_2CF(CF_3)O)_m)_n-X^5$$

wherein m is an integer of 0 to 5; n is an integer of 1 to 3; and $X^5$ is a cyano group, a carboxy group, an alkoxycarbonyl group, an iodine atom, a bromine atom, or —CH$_2$I;

fluoromonomers represented by the following formula (15):

$$CH_2=CFCF_2O(CF(CF_3)CF_2O)_m(CF(CF_3))_n-X^6$$

wherein m is an integer of 0 to 5; n is an integer of 1 to 3; and $X^6$ is a cyano group, a carboxy group, an alkoxycarbonyl group, an iodine atom, a bromine atom, or —CH$_2$OH; and monomers represented by the following formula (16):

$$CR^{162}R^{163}=CR^{164}-Z-CR^{165}=CR^{166}R^{167}$$

wherein $R^{162}$, $R^{163}$, $R^{164}$, $R^{165}$, $R^{166}$, and $R^{167}$ are the same as or different from each other, and are each a hydrogen atom or a C1-C5 alkyl group; Z is a C1-C18 linear or branched alkylene group optionally containing an oxygen atom, a C3-C18 cycloalkylene group, a C1-C10 at least partially fluorinated alkylene or oxyalkylene group, or a (per)fluoropolyoxyalkylene group which is represented by the following formula:

$$-(Q)_p-CF_2O-(CF_2CF_2O)_n-CF_2-(Q)_p-$$

(wherein Q is an alkylene group or an oxyalkylene group; p is 0 or 1; and min is 0.2 to 5) and which has a molecular weight of 500 to 10000.

$X^3$ is preferably a fluorine atom. $Rf^{121}$ and $Rf^{131}$ are each preferably a C1-C5 perfluoroalkylene group. $R^{121}$ is preferably a hydrogen atom. $X^5$ is preferably a cyano group, an alkoxycarbonyl group, an iodine atom, a bromine atom, or —CH$_2$I. $X^6$ is preferably a cyano group, an alkoxycarbonyl group, an iodine atom, a bromine atom, or —CH$_2$OH.

The monomer giving a crosslinking site is preferably at least one selected from the group consisting of CF$_2$=CFOCF$_2$CF(CF$_3$)OCF$_2$CF$_2$CN, CF$_2$αCFOCF$_2$CF(CF$_3$)OCF$_2$CF$_2$COOH, CF$_2$=CFOCF$_2$CF(CF$_3$)OCF$_2$CF$_2$CH$_2$I, OF$_2$=CFOCF$_2$CF$_2$OH$_2$I, CH$_2$=CFCF$_2$OCF(CF$_3$)CF$_2$OCF(CF$_3$) CN, CH$_2$=CFCF$_2$OCF(CF$_3$)CF$_2$OCF(CF$_3$)COOH, CH$_2$=CFCF$_2$OCF(CF$_3$)CF$_2$OCF(CF$_3$)CH$_2$OH, CH$_2$=CHCF$_2$CF$_2$I, CH$_2$=CH(CF$_2$)$_2$CH=CH$_2$, CH$_2$=CH(CF$_2$)$_6$CH=CH$_2$, and CF$_2$=CFO(CF$_2$)$_5$CN, more preferably at least one selected from the group consisting of CF$_2$=CFOCF$_2$CF(CF$_3$)OCF$_2$CF$_2$CN and CF$_2$=CFOCF$_2$CF$_2$CH$_2$I.

In order to achieve excellent compression set performance at high temperature, the fluorine-containing elastomer preferably has a glass transition temperature of −70° C. or higher, more preferably −60° C. or higher, still more preferably −50° C. or higher. In order to achieve good cold resistance, the glass transition temperature is preferably 5° C. or lower, more preferably 0° C. or lower, still more preferably −3° C. or lower.

The glass transition temperature can be determined as follows. Specifically, using a differential scanning calorimeter (DSC822e, Mettler-Toledo International Inc.), 10 mg of a sample is heated at a rate of 10° C./min to give a DSC curve, and the temperature is read at the intermediate point of two intersections between each of the extension lines of the base lines before and after the secondary transition of the DSC curve and the tangent line at the inflection point of the DSC curve.

In order to achieve good heat resistance, the fluorine-containing elastomer preferably has a Mooney viscosity ML(1+20) of 30 or higher, more preferably 40 or higher, still more preferably 50 or higher, at 170° C. In order to achieve good processability, this Mooney viscosity is preferably 150 or lower, more preferably 120 or lower, still more preferably 110 or lower.

In order to achieve good heat resistance, the fluorine-containing elastomer preferably has a Mooney viscosity ML (1+20) of 30 or higher, more preferably 40 or higher, still more preferably 50 or higher, at 140° C. In order to achieve good processability, this Mooney viscosity is preferably 180 or lower, more preferably 150 or lower, still more preferably 110 or lower.

In order to achieve good heat resistance, the fluorine-containing elastomer preferably has a Mooney viscosity ML(1+10) of 10 or higher, more preferably 20 or higher, still more preferably 30 or higher, at 100° C. In order to achieve good processability, this Mooney viscosity is preferably 120 or lower, more preferably 100 or lower, still more preferably 80 or lower.

The Mooney viscosity can be determined using a Mooney viscometer MV2000E (Alpha Technologies Inc.) at 170° C., 140° C., or 100° C. in conformity with JIS K6300.

The aforementioned partially fluorinated elastomer and perfluoroelastomer can be produced by a usual method. In order to make the molecular weight distribution of the resulting polymer narrow and control the molecular weight thereof easily, and to introduce an iodine atom or a bromine atom into an end, an iodine compound or a bromine compound may be used as a chain-transfer agent. An example of a polymerization method using an iodine compound or a bromine compound is a method in which emulsion polymerization is performed under pressure in an aqueous medium in the presence of an iodine compound or bromine compound substantially without oxygen (iodine transfer polymerization). Representative examples of the iodine compound or the bromine compound used include compounds represented by the following formula:

$$R^{13}I_xBr_y$$

(wherein x and y are each an integer of 0 to 2 and satisfy 1≤x+y≤2; and $R^{13}$ is a C1-C16 saturated or unsaturated fluorohydrocarbon group or chlorofluorohydrocarbon group, or a C1-C3 hydrocarbon group, each of which optionally contains an oxygen atom). The presence of an iodine compound or a bromine compound enables introduction of an iodine atom or a bromine atom into the polymer, and such an atom serves as a crosslinking site.

Examples of the iodine compound and the bromine compound include 1,3-diiodoperfluoropropane, 2-iodoperfluoropropane, 1,3-diiodo-2-chloroperfluoropropane, 1,4-diiodoperfluorobutane, 1,5-diiodo-2,4-dichloroperfluoropentane, 1,6-diiodoperfluorohexane, 1,8-diiodoperfluorooctane, 1,12-diiodoperfluorododecane, 1,16-diiodoperfluorohexadecane, diiodomethane, 1,2-diiodoethane, 1,3-diiodo-n-propane, $CF_2Br_2$, $BrCF_2CF_2Br$, $CF_3CFBr4F_2Br$, $CFClBr_2$, $BrCF_2CFClBr$, $CFBrClCFClBr$, $BrCF_2CF_2CF_2Br$, $BrCF_2CFBrOCF_3$, 1-bromo-2-iodoperfluoroethane, 1-bromo-3-iodoperfluoropropane, 1-bromo-4-iodoperfluorobutane, 2-bromo-3-iodoperfluorobutane, 3-bromo-4-iodoperfluorobutene-1,2-bromo-4-iodoperfluorobutene-1, and monoiodomonobromo-substituted products of, diiodomonobromo-substituted products of, and (2-iodoethyl)- and (2-bromoethyl)-substituted products of benzene. These compounds may be used alone or in any combination.

In order to achieve good polymerization reactivity, good crosslinking reactivity, and easy availability, preferred are 1,4-diiodoperfluorobutane, 1,6-diiodoperfluorohexane, and 2-iodoperfluoropropane.

The composition of the invention contains a hyperbranched polymer of a cage silsesquioxane represented by the following formula (1). The presence of the hyperbranched polymer allows the composition of the invention to provide a molded article that has excellent heat resistance and a small weight change against oxygen plasma. The presence of the hyperbranched polymer also enables a small weight change against fluorine plasma.

The formula (1) is as follows:

[Chem. 5]

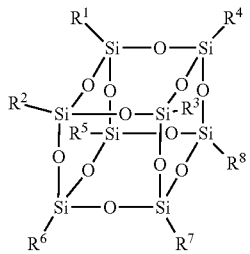

wherein $R^1$ to $R^6$ are each individually a hydrogen atom, a halogen atom, or an organic group, and at least one of $R^1$ to $R^8$ is an organic group.

The organic group is preferably an alkyl group, an alkoxy group, or a phenyl group.

The alkyl group and the alkoxy group preferably have a carbon number of 1 to 1000, more preferably 1 to 600, still more preferably 1 to 400. If the carbon number is 2 or greater, two carbon atoms may be coupled via a bond such as an amide bond, an imide bond, an ester bond, a urethane bond, or a carbonate bond.

$R^1$ to $R^8$ may contain a cyclic structure such as an aromatic ring. $R^1$ to $R^8$ may contain a group such as an amino group, a nitro group, a carboxy group, a sulfo group, a hydroxy group, a vinyl group, an epoxy group, a silyl group, or an isocyanate group.

The phenyl group may be substituted with one or more substituents.

$R^1$ to $R^8$ preferably contain a cyclic structure such as an aromatic ring. The presence of a cyclic structure such as an aromatic ring in $R^1$ to $R^8$ enables radial arrangement of rigid structures at apexes of the cage silsesquioxane lattice. This leads to excellent heat resistance and plasma resistance.

$R^1$ to $R^8$ more preferably contain an alkylene group, an oxyalkylene group, or a divalent group represented by —$C_6H_4$—NH—, and a divalent to hexavalent benzene ring. The benzene ring is still more preferably a trivalent one. The carbon number of each of the alkylene group and the oxyalkylene group may be 1 to 10, and is preferably 1 to 5.

The term "n-valent benzene ring" herein means that n hydrogen atoms in the benzene ring are replaced by other organic groups.

The cage silsesquioxane hyperbranched polymer usually has a molecular weight and molecular structure distributions. The hyperbranched polymer has irregular branches and is very easy to synthesize in comparison with dendrimers including a core and completely regular dendritic branches from the core (polymer having a single molecular weight and having no molecular weight distribution). The cage silsesquioxane hyperbranched polymer may have a molecular weight distribution (Mw/Mn) of 1 to 20, preferably not smaller than 1, more preferably 2 or greater.

The molecular weight distribution can be determined by gel permeation chromatography.

In order to achieve good solubility, the hyperbranched polymer preferably has a number average molecular weight of 2,000 to 300,000. The number average molecular weight is more preferably 4,000 to 30,000.

The number average molecular weight can be determined by gel permeation chromatography.

The hyperbranched polymer has a highly branched molecular structure and is amorphous. The hyperbranched polymer also has many chain ends to which a functional group is introducible.

The hyperbranched polymer can be produced by a single process of polycondensation of monomers in comparison with a dendrimer which is produced by step-by-step chemical reactions of multifunctional group-containing monomers to form a regular branch structure (a structure having a core moiety and multiple branched chain moieties around the core). Thus, the hyperbranched polymer can be more easily produced than dendrimers, and the production cost thereof is inexpensive.

The number of branches can be controlled by adjusting the synthesis conditions as appropriate, and the molecules can be easily designed in accordance with the application thereof.

The hyperbranched polymer includes a cage silsesquioxane skeleton as a core and $R^1$ to $R^8$ as hyperbranches.

The composition containing a cage silsesquioxane hyperbranched polymer can provide a molded article having a small weight change against oxygen plasma exposure and fluorine plasma exposure in a semiconductor device manufacturing step. Also, advantageously, the molecular size can be controlled by controlling the number of branches.

The hyperbranched polymer is preferably such that $R^1$ to $R^8$ in the formula (1) each individually contain a terminal group T represented by the following formula (2).

The formula (2) is as follows:

[Chem. 6]

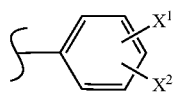

wherein $X^1$ and $X^2$ are each individually —$NH_2$, —OH, —SH, —H, —NH—CO—$CF_3$, or a group represented by the following formula:

[Chem.7]

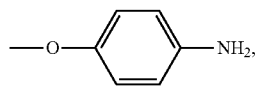

and preferred is —$NH_2$.

$R^1$ to $R^8$ are also preferably an organic group containing a terminal group T represented by the following formula:

[Chem. 8]

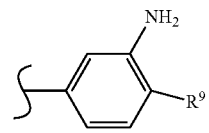

wherein $R^9$s are the same as or different from each other, and are each —$NH_2$, —$NHR^{10}$, —OH, or —SH; and $R^{10}$ is fluorine atom or a monovalent organic group.

The monovalent, organic group for $R^{10}$ may be an aliphatic hydrocarbon group, a phenyl group, or a benzyl group. Specifically preferably, for example, at least one $R^{10}$ is a C1-C10, particularly C1-C6 lower alkyl group such as —$CH_3$, —$C_2H_5$, or —$C_3H_7$; a C1-C10, particularly C1-C6 fluorine-containing lower alkyl group such as —$C_2F_5$, —$CH_2F$, —$CH_2CF_3$, or a phenyl group; a benzyl group; a group obtainable by replacing one to five hydrogen atoms in a phenyl or benzyl group by fluorine atoms, such as —$C_6F_5$ or —$CH_2C_6F_5$; or a group obtainable by replacing one to five hydrogen atoms in a phenyl or benzyl group by —$CF_3$, such as —$C_6H_{5-n}(CF_3)_n$ or —$CH_2C_6H_{5-n}(CF_3)_n$ (Wherein n is an integer of 1 to 5).

In order to achieve good crosslinking reactivity, $R^9$ is preferably —$NH_2$ or —OH, more preferably —$NH_2$.

When the phenyl group of the terminal group T includes —$NH_2$ and $R^9$ in the ortho arrangement, the hyperbranched polymer can also serve as a cross-linking agent. Thus, the hyperbranched polymer can provide a molded article having much better heat resistance and plasma resistance without a common cross-linking agent to be mentioned later.

When the hyperbranched polymer is used as a cross-linking agent, the fluorine-containing polymer is preferably a copolymer containing a polymerized unit based on a fluoromonomer giving a crosslinking site. The fluoro homer giving a crosslinking site is more preferably a monomer containing a cyano group.

For the terminal group T, a group represented by the following formula:

[Chem. 9]

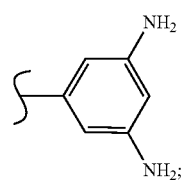

a group represented by the following formula:

[Chem. 10]

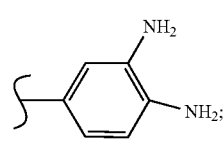

a group represented by the following formula:

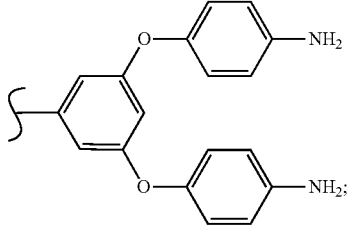

and a group represented by the following formula:

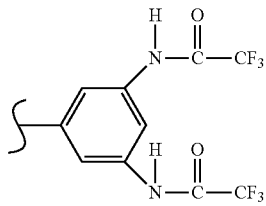

are more preferred.

Examples of the cage silsesquioxane hyperbranched polymer include those satisfying that $R^1$ to $R^8$ in the formula (1) contain a divalent group B1 represented by the following formula:

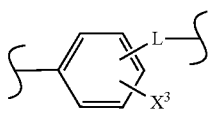

wherein L is a divalent group represented by —NH—CO—, —O—CO—, —O—, —CO—, or —OCH$_2$—. L is preferably a divalent group represented by —NH—CO—. In the formula, $X^3$ is the same as $X^1$ and $X^2$. In the formula, $X^3$ is preferably —NH$_2$.

The divalent group B1 is preferably one represented by the following formula (3-1).

The formula (3-1) is as follows.

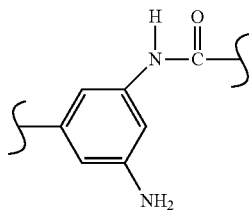

The cage silsesquioxane hyperbranched polymer may be one such that $R^1$ to $R^8$ in the formula (1) contain a trivalent group B2 represented by the following formula:

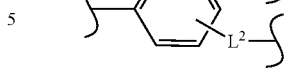

wherein $L^1$ and $L^2$ are each individually a divalent group represented by —NH—CO—, —O—CO—, —O—, —CO—, or —OCH$_2$—. $L^1$ and $L^2$ are preferably a divalent group represented by —NH—CO—.

The trivalent group B2 is preferably one represented by the following formula (3-2).

The formula (3-2) is as follows.

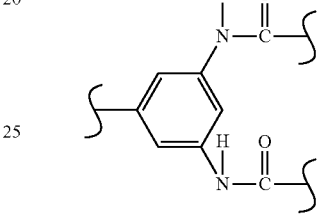

The cage silsesquioxane hyperbranched polymer is preferably such that at least one of $R^1$ to $R^8$ includes a divalent group B1 or has a structure in which one of $L^1$ and $L^2$ of a trivalent group B2 is coupled with the terminal group T and the other is coupled with a divalent group B1 or a trivalent group B2.

The cage silsesguioxane hyperbranched polymer is preferably such that a divalent group B1 or a trivalent group B2 binds to a silicon atom of the cage silsesquioxane via a divalent group A1 represented by the following formula:

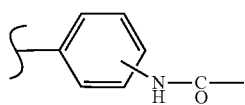

or a divalent group A2 represented by —(CH$_2$)$_1$—NH—CO— (wherein 1 is an integer of 1 to 5) or such that a divalent group B1 or a trivalent group B2 binds to a silicon atom of the cage silsesguioxane via the divalent group A1 or A2 and the terminal group T binds to a divalent group A1 or A2 via a divalent group B1 or a trivalent group B2. A plurality of divalent groups B1 or trivalent groups B2 may bind thereto.

In order to achieve good solubility, $R^1$ to $R^8$ preferably contain 1 to 250, more preferably 1 to 60, divalent groups B1 and trivalent groups B2 in total.

Examples of $R^1$ to $R^8$ include the following structures. In the formulas, A is A1 or A2; B is a divalent group B1 when it is a divalent group or a trivalent group B2 when it is a trivalent group.

[Chem. 18]

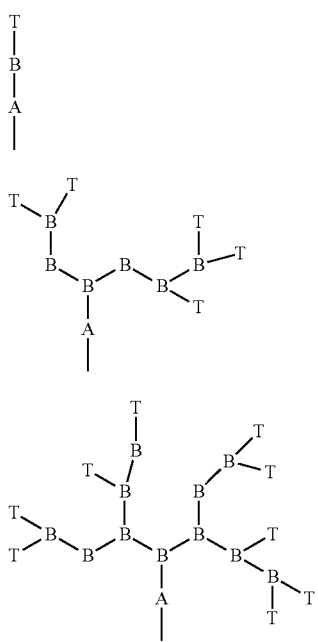

[Chem. 19]

[Chem. 20]

The following gives specific examples of the structures of $R^1$ to $R^8$ in the hyperbranched polymer.

[Chem. 21]

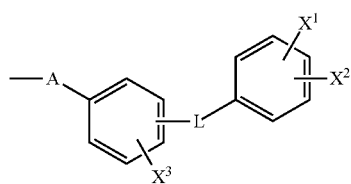

In the formula, A, $X^1$, $X^2$, $X^3$, and L are defined in the same manner as mentioned above.

More specific examples are shown below.

[Chem. 22]

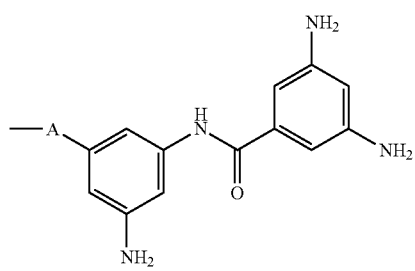

Any of $R^1$ to $R^8$ may have any of the following structures.

[Chem. 23]

[Chem. 24]

[Chem. 25]

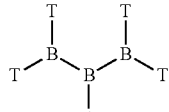

[Chem. 26]

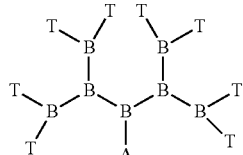

[Chem. 27]

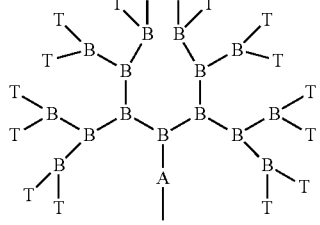

The hyperbranched polymer can be produced by adding a monomer containing a multifunctional group in small portions to a cage silsesquioxane and thereby causing a reaction. Alternatively, the hyperbranched polymer can be produced by mixing a cage silsesguioxane and a monomer containing a multifunctional group and then causing a reaction.

The composition preferably contains 0.5 to 100 parts by mass of the cage silsesguioxane hyperbranched polymer relative to 100 parts by mass of the fluorine-containing polymer. The amount thereof is more preferably 5 to 50 parts by mass, still more preferably 5 to 25 parts by mass. Too small an amount of the cage silsesquioxane hyperbranched polymer may exhibit poor reinforceability, while too large an amount of the cage silsesquioxane hyperbranched polymer may make the composition hard, causing poor sealability.

The composition preferably further contains a crosslinking agent. Examples of the cross-linking agent include cross-linking agents to be used in any of peroxide crosslinking, polyol crosslinking, polyamine crosslinking, triazine crosslinking, oxazole crosslinking, imidazole crosslinking, and thiazole crosslinking.

Cross-linking agents to be used in peroxide crosslinking may be any organic peroxides that can easily generate peroxy radicals in the presence of heat or a redox system. Specific examples thereof include 1,1-bis(t-butylperoxy)-3,5,5-trimethylcyclohexane, 2,5-dimethylhexane-2,5-dihydroperoxide, di-t-butyl peroxide, t-butylcumyl peroxide, dicumyl peroxide, α,α-bis(t-butylperoxy)-p-diisopropylbenzene, 2,5-dimethyl-2,5-di(t-butylperoxy)hexane, 2,5-dimethyl-2,5-di(t-butylperoxy)-hexyne-3, benzoyl peroxide, t-butylperoxybenzene, 2,5-dimethyl-2,5-di(benzoylperoxy) hexane, t-butylperoxy maleate, t-butylperoxy isopropyl carbonate, and 1,3-bis(t-butylperoxyisopropyl)benzene. The type and amount of an organic peroxide are usually chosen in consideration of factors such as the amount of active —O—O— and the decomposition temperature.

Any crosslinking aid that is a compound reactive with peroxy radicals and polymer radicals may be used in this case. Examples thereof include multifunctional compounds containing functional groups such as $CH_2=CH-$, $CH_2=CHCH_2-$, and $CF_2=CF-$. Specific examples thereof include triallyl cyanurate, triallyl isocyanurate (TAIC), triacrylformal, triallyl trimellitate, N,N'-n-phenylene bismaleimide, dipropargyl terephthalate, diallyl phthalate, tetraallyl terephthalate amide, triallyl phosphate, bismaleimide, fluorinated triallyl isocyanurate (1,3,5-tris(2,3,3-trifluoro-2-propenyl)-1,3,5-triazine-2,4,6-trione), tris (diallylamine)-S-triazine, triallyl phosphite, N,N-diallylacrylamide, and 1,6-divinyldodecafluorohexane.

Examples of cross-linking agents to be used in polyol crosslinking include polyhydric alcohol compounds such as bisphenol A and bisphenol AF.

Examples of cross-linking agents to be used in polyamine crosslinking include polyvalent amine compounds such as hexamethylenediamine carbamate, N,N'-dicinnamylidene-1,6-hexanediamine, and 4,4'-bis(aminocyclehexyl)methane carbamate.

Examples of cross-linking agents to be used in triazine crosslinking include organotin compounds such as tetraphenyltin and triphenyltin.

Examples of cross-linking agents to be used in any of oxazole crosslinking systems, imidazole crosslinking systems, and thiazole crosslinking systems include:

bisdiaminophenyl cross-linking agents, bisaminophenol cross-linking agents, and bisaminothiophenol cross-linking agents represented by the following formula (20):

[Chem. 28]

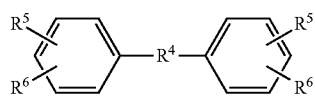
(20)

(wherein $R^4$ is —$SO_2$—, —O—, —CO—, a C1-C6 alkylene group, a C1-C10 perfluoroalkylene group, a single bond, or a group represented by the following formula:

[Chem. 29]

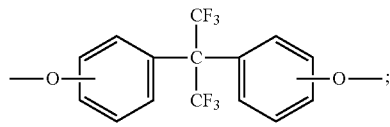

one of $R^5$ and $R^6$ is —$NH_2$ and the other is —$NHR^7$, —$NH_2$, —OH, or —SH; $R^7$ is a hydrogen atom, a fluorine atom, or a monovalent organic group, preferably $R^5$ is —$NH_2$ and $R^6$ is —$NHR^7$; the C1-C6 alkylene group may preferably specifically be a methylene group, an ethylene group, a propylene group, a butylene group, a pentylene group, a hexylene group, or the like, and the C1-C10 perfluoroalkylene group may be a group represented by the following formula:

[Chem. 30]

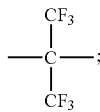

these compounds are known examples of bisdiaminophenyl compounds disclosed in, for example, JP H02-59177 B and JP H08-120146 A);

bisamidrazone cross-linking agents represented by the following formula (21):

[Chem. 31]

(21)

$R^8$—⌬—$R^4$—⌬—$R^8$;

(wherein $R^4$ is defined in the same manner as mentioned above, and $R^8$ is 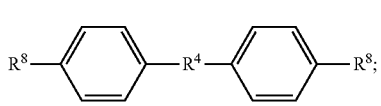)

and bisamidoxime cross-linking agents represented by the following formula (22):

[Chem. 32]

(22)

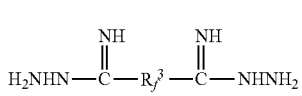

(wherein $R_f^3$ is a C1-C10 perfluoroalkylene group) or the following formula (23):

[Chem. 33]

(23)

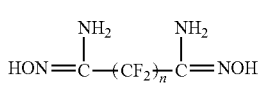

(wherein n is an integer of 1 to 10). These bisaminophenol cross-linking agents, bisaminothiophenol cross-linking agents, and bisdiaminophenyl cross-linking agents are conventionally used for crosslinking systems where a cyano group serves as a crosslinking point. Further, they can also react with a carboxy group and an alkoxycarbonyl group and form an oxazole ring, thiazole ring, or imidazole providing a crosslinked product.

Particularly preferred examples of the cross-linking agent include compounds containing multiple 3-amino-4-hydroxyphenyl groups or 3-amino-4-mercaptophenyl groups and compounds represented by the following formula (24):

[Chem. 34]

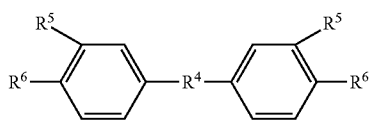

(24)

(wherein R⁴, R⁵, and R⁶ are defined in the same manner as mentioned above). Specific examples thereof include 2,2-bis(3-amino-4-hydroxyphenyl)hexafluoropropane (common name: bis(aminophenol) AF), 2,2-bis(3-amino-4-mercaptophenyl)hexafluoropropane, tetraaminobenzene, bis-3,4-diaminophenylmethane, bis-3,4-diaminophenylether, 2,2-bis(3,4-diaminophenyl)hexafluoropropane, 2,2-bis[3-amino-4-(N-phenylamino)phenyl]hexafluoropropane, 2,2-bis[3-amino-4-(N-methylamino)phenyl]hexafluoropropane, 2,2-bis[3-amino-4-(N-ethylamino)phenyl]hexafluoropropane, 2,2-bis[3-amino-4-(N-oropylamino)phenyl]hexafluoropropane, 2,2-bis[3-amino-4-(N-perfluorophenylamino)phenyl] hexafluoropropane, and 2,2-bis[3-amino-4-(N-benzylamino)phenyl]hexafluoropropane.

In order to achieve heat resistance, steam resistance, amine resistance, and good crosslinkability, the cross-linking agent is preferably 2,2-bis[3-amino-4-(N-phenylamino)phenyl]hexafluoropropane.

The cross-linking agent is preferably present in an amount of 0.05 to 10 parts by mass, more preferably 0.5 to 5 parts by mass, relative to 100 parts by mass of the fluorine-containing polymer. Less than 0.05 parts by mass of the cross-linking agent tends to cause insufficient crosslinking of the fluorine-containing polymer, while more than 10 parts by mass thereof tends to impair the physical properties of the crosslinked product.

The composition may contain a common filler.

Examples of the common filler include imide fillers having an imide structure such as polyimide, polyamide-imide, and polyetherimide; organic fillers made of engineering plastic such as polyarylate, polysulfone, polyethersulfone, polyphenylene sulfide, polyether ether ketone, polyether ketone, and polyoxybenzoate; metal oxide fillers such as aluminum oxide, silicon oxide, and yttrium oxide; metal carbides such as silicon carbide and aluminum carbide and metal nitride fillers such as silicon nitride and aluminum nitride; and inorganic fillers such as aluminum fluoride and carbon fluoride.

In order to achieve an effect of blocking a variety of plasma, preferred among these are aluminum oxide, yttrium oxide, silicon oxide, polyimide, and carbon fluoride.

The inorganic fillers and organic fillers may be used alone or in combination of two or more.

The amount of the common filler is preferably 0.5 to 100 parts by mass, more preferably 5 to 50 parts by mass, relative to 100 parts by mass of the fluorine-containing polymer.

For fields where a high purity and non-staining properties are not required, usual additives as appropriate to be Used in fluorine-containing polymer compositions, such as fillers, processing aids, plasticizers, and colorants, may be blended with the compositions, and one or more of usual cross-linking agents and crosslinking aids different from those mentioned above may be blended with the compositions.

The composition can be prepared by mixing the above components using a common polymer processing machine, such as an open roll mill, a Banbury mixer, or a kneader. The composition may alternatively be prepared using a closed-type mixer. The composition can be suitably used as a molding material to be molded into a molded article, and can be suitably used as a molding material to be crosslink-molded into a molded article.

The composition, when used as a molding material, may reformed into a preform by any usually known method, such as thermocompression in a mold, injection into a heated mold, or extrusion through an extruder. In production of an extruded article, such as a hose or an electric wire, the molded article can be produced by extrusion and subsequent heat crosslinking with steam, for example.

The crosslinking conditions are as follows.
(Standard Composition)
  Fluorine-containing polymer: 100 parts by mass
  Cross-linking agent (2,2-bis[3-amino-4-(N-phenylamino)phenyl]hexafluoropropane): 1 part by mass
  Silicon compound: 15 parts by mass
(Standard Crosslinking Conditions)
  Kneading method: roll kneading
  Press crosslinking: 180° C. for 30 minutes
  Oven crosslinking: 290° C. for 18 hours
Unless otherwise mentioned, crosslinking is performed under these conditions.

The invention also relates to a molded article obtainable from the above composition.

The molded article of the invention can suitably be used as a sealant for semiconductor equipment particularly required to have high cleanliness and semiconductor equipment particularly performing high-density plasma irradiation. Examples of the sealant include O-rings, square rings, gaskets, packings, oil seals, bearing seals, and lip seals.

The molded article may also be used as any of various polymer products for semiconductor equipment, such as diaphragms, tubes, hoses, various rubber rolls, and belts. The molded article may also be used as a material for coating or a material for lining.

The semiconductor equipment as used herein is not limited to equipment for manufacturing semiconductors but widely includes general manufacturing equipment used in the semiconductor field required to have high cleanliness, such as equipment for manufacturing liquid crystal panels or plasma panels. Examples thereof include the following.
(1) Etching Systems
  Dry etching systems
  Plasma etching systems
  Reactive ion etching systems
  Reactive ion beam etching systems
  Sputter etching systems
  Ion beam etching systems
  Wet etching systems
  Ashing systems
(2) Cleaning Systems
  Dry etching and cleaning systems
  UV/$O_3$ cleaning systems
  Ion beam cleaning systems
  Laser beam cleaning systems
  Plasma cleaning systems
  Gas etching and cleaning systems
  Extraction and cleaning systems
  Soxhlet extraction and cleaning systems
  High-temperature and high-pressure extraction and cleaning systems
  Microwave extraction and cleaning systems
  Supercritical extraction and cleaning systems (3) Exposure Systems
  Steppers
  Coaters/developers
(4) Polishing Systems
  CMP systems
(5) Film Deposition Systems
  CVD systems
  Sputtering systems
(6) Diffusion and Ion Implantation Systems
  Oxidation and diffusion systems
  ion implantation systems The molded article of the invention exhibits excellent performance as a sealant of, for example, a CVD system, plasma etching system, reactive ion etching system, asking system, or excimer laser exposure system.

EXAMPLES

The invention is described hereinbelow with reference to, but not limited to, examples.
(Molecular Weight and Molecular Weight Distribution)
The molecular weight and the molecular weight distribution were determined by gel permeation chromatography (column: TSKgel GMH$_{HR}$-M, Tosoh Corp.) in a standard polystyrene equivalent.

Synthesis Example 1 (Production of Hyperbranched Polymer)

In accordance with the method described in Polymer, 2003, 44, 4491-4499, an amino-containing POSS was synthesized in the procedure shown in the following scheme.

[Chem. 35]

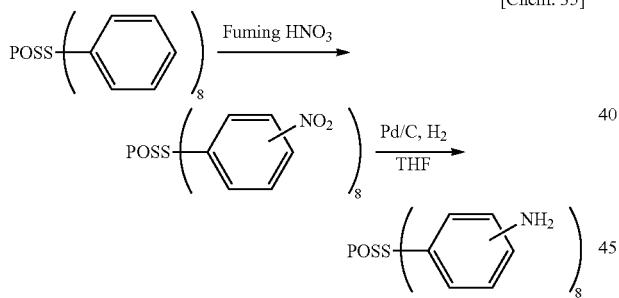

Then, the amino-containing POSS (0.043 mmol) was dissolved in 1 mL, of N,N-dimethylacetamide (DMAc). This solution was heated up to 120° C. in a nitrogen atmosphere, and thereto were added dropwise triphenyl phosphite (2.7 mmol) and a solution of 3,5-diaminobenzoic acid (2.4 mmol) in DMAc (2 ml) over one hour. The dropwise addition was followed by the reaction at 120° C. for another 1.5 hours. The reaction was followed by reprecipitation of the reaction solution in 5% baking soda water. The solid precipitated was collected by filtration. The solid was subjected to a washing operation, i.e., the solid was put into 5% baking soda water, stirred, and collected by filtration. The solid was then dried under reduced pressure at room temperature, thereby providing the target m-phenylenediamine-terminated hyperbranched polymer equivalent to the third generation. The yield thereof was 88%. The resulting hyperbranched polymer had a weight average molecular weight (Mw) and a molecular weight distribution (Mw/Mn) of Mn=80,600 and Mw/Mn=4.1, respectively.

[Chem. 36]

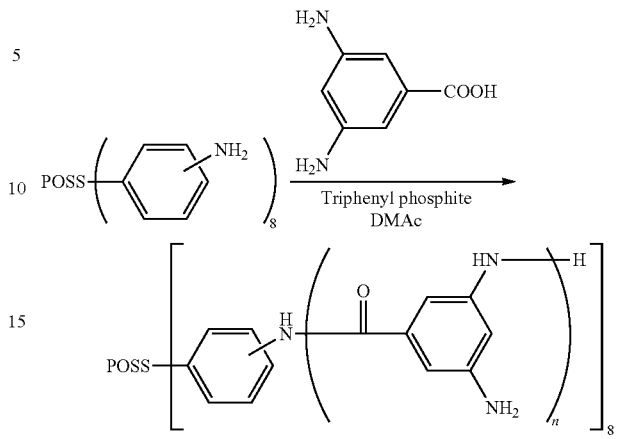

In the above scheme, n is the sum of the numbers of the group represented by the following formula (A):

[Chem. 37]

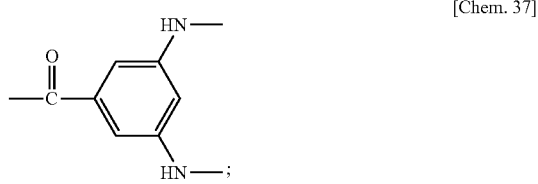

the group represented by the following formula (B):

[Chem. 38]

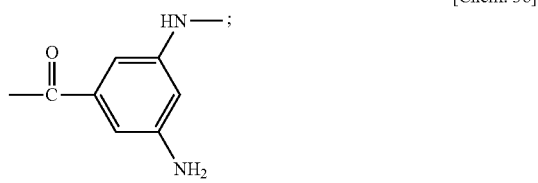

and the group represented by the following formula (C):

[Chem. 39]

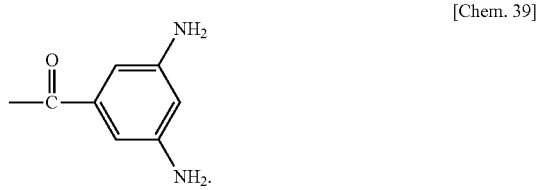

The portion parenthesized with n essentially includes the structures of the formulas B and C. The aforementioned amino-containing POSS is a compound represented by the following formula:

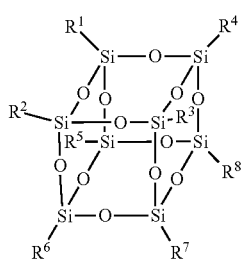

wherein $R^1$ to $R^8$ are —$C_6H_4$—$NH_2$.

Synthesis Example 2

The amino-containing POSS (0.095 mmol) was dissolved in 1 mL of DMAc. This solution was heated up to 120° C. in a nitrogen atmosphere, and thereto were added dropwise triphenyl phosphite (2.7 mmol) and a solution of 3,5-diaminobenzoic acid (2.4 mmol) in DMAc (2 mL) over one hour. The dropwise addition was followed by the reaction at 120° C. for another 1.5 hours. To this reaction solution were added triphenyl phosphite (3.7 mmol) and a solution of 3,4-bis(trifluproacetamido)benzoic acid (3.3 mmol) in DMAc (2 mL), and the components were reacted for another three hours. The reaction was followed by reprecipitation of the reaction solution in 5% baking soda water. The solid precipitated was collected by filtration and dried under reduced pressure at room temperature. The resulting solid was dissolved in 4 mL of DMAc. Thereto was added 5 mL of hydrazine, and the components were reacted at 50° C. for two hours. The reaction was followed by reprecipitation of the reaction solution in 5% baking soda water. The solid precipitated was collected by filtration and dried under reduced pressure at room temperature, thereby providing the target o-phenylenediamine-terminated hyperbranched polymer equivalent to the third generation. The yield thereof was 92%. The resulting hyperbranched polymer had Mw and Mw/Mn of Mw=58,900 and Mw/Mn=3.8, respectively.

Synthesis Example 3

The m-phenylenediamine-terminated hyperbranched polymer (0.02 mmol) obtained in Synthesis Example 1 was dissolved in 3 mL of DMAc. Thereto was added trifluoroacetic anhydride (2.6 mmol), and the components were reacted at room temperature for six hours. The reaction solution was reprecipitated in 5% baking soda water, and the solid precipitated was collected by filtration. The solid was subjected to a washing operation, i.e., the solid was put into 5% baking soda water, stirred, and collected by filtration. The solid was then dried under reduced pressure at room temperature, thereby providing the target m-phenylenebis(trifluoroacetamide)-terminated hyperbranched polymer equivalent to the third generation. The yield thereof was 91%. The resulting hyperbranched polymer had Mw and Mw/Mn of Mw=60,100 and Mw/Mn=3.3, respectively.

Example 1

First, 100 parts by mass of a fluorine-containing elastomer (TFE/PMVE/cyano-containing monomer=59.4/40.1/0.5 (mole ratio)), 10 parts by mass of the third generation-equivalent hyperbranched polymer (m-phenylenediamine-terminated hyperbranched polymer) obtained in Synthesis Example 1, and 0.6 parts by mass of a cross-linking agent 2,2-bis[3-amino-4-(N-phenylamino)phenyl]hexafluoropropane were pre-mixed in 1500 parts by mass of a fluorine-containing solvent. Then, the fluorine-containing solvent was evaporated at 60° C. and the residue was kneaded using an open roll mill. Thereby, a fluorine-containing elastomer composition was obtained. The fluorine-containing solvent used was R-318 (Daikin Industries, Ltd., main component: $C_4F_8Cl_2$).

The resulting fluorine-containing elastomer composition was press-crosslinked at 180° C. for 30 minutes, and then oven-crosslinked in a 290° C. oven over 18 hours. Thereby, a molded article was obtained.

The resulting molded article was subjected to the plasma resistance evaluation to be described later. The results of plasma resistance evaluation are shown in Table 1.

Example 2

A fluorine-containing elastomer composition was obtained in the same manner as in Example 1 except that the third generation-equivalent hyperbranched polymer obtained in Synthesis Example 1 was changed to the third generation-equivalent o-phenylenediamine-terminated hyperbranched polymer obtained in Synthesis Example 2. A molded article was obtained from the fluorine-containing elastomer composition in the same manner as in Example 1. The resulting molded article was subjected to the plasma resistance evaluation to be described later. The results of plasma resistance evaluation are shown in Table 1.

Example 3

A fluorine-containing elastomer composition was obtained in the same manner as in Example 1 except that the third generation-equivalent hyperbranched polymer obtained in Synthesis Example 1 was changed to the third generation-equivalent m-phenylenebis(trifluoroacetamide)-terminated hyperbranched polymer obtained in Synthesis Example 3. A molded article was of from the fluorine-containing elastomer composition in the same manner as in Example 1. The resulting molded article was subjected to the plasma resistance evaluation to be described later. The results of plasma resistance evaluation are shown in Table 1.

Comparative Example 1

A fluorine-containing elastomer composition was obtained in the same manner as in Example 1 except that the hyperbranched polymer obtained in Synthesis Example 1 was not used. A molded article was obtained from the fluorine-containing elastomer composition in the same manner as in Example 1. The resulting molded article was subjected to the plasma resistance evaluation to be described later. The results of plasma resistance evaluation are shown in Table 1.

(Plasma Resistance Evaluation)

Each of the molded articles obtained in Examples 1 to 3 and Comparative Example 1 was partially covered with an electrically insulating Kapton tape, and then subjected to oxygen plasma and $CF_4$ plasma irradiations under the following conditions. The step between the covered surface and the exposed surface was measured to determine the amount of the material etched. The results are shown in Table 1.

Oxygen plasma irradiation conditions:
  Amount of gas flow: 16 scan
  RE output: 400 W
  Pressure: 2.6 Pa
  Etching time: 30 minutes CF$_4$ plasma irradiation conditions:
  Amount of gas flow: 16 sccm
  RF output: 400 W
  Pressure: 2.6 Pa
  Etching time: 30 minutes
Measurement of amount of material etched:
  The step between the covered surface and the exposed surface was measured using a laser scanning microscope VK-9700 (Keyence Corp.) to determine the amount of the material etched.

TABLE 1

|  |  | Example 1 | Example 2 | Example 3 | Comparative Example 1 |
|---|---|---|---|---|---|
| Composition (parts by mass) | Fluorine-containing elastomer | 100 | 100 | 100 | 100 |
|  | Crosslinker | 0.8 | 0.8 | 0.8 | 0.8 |
|  | m-Phenylenediamine-terminated hyperbranched polymer | 10 | 0 | 0 | 0 |
|  | o-Phenylenediamine-terminated hyperbranched polymer | 0 | 10 | 0 | 0 |
|  | m-Phenylenebis(trifluoroacetamide) hyperbranched polymer | 0 | 0 | 10 | 0 |
| Amount of material etched (nm) | Oxygen plasma | 22700 | 22100 | 21500 | 31900 |
|  | CF$_4$ Plasma | 5300 | 5500 | 4800 | 8400 |

Example 4

First, 100 parts by mass of a fluorine-containing elastomer and 10 parts by mass of the third generation-equivalent hyperbranched polymer (m-phenylenediamine-terminated hyperbranched polymer) obtained in Synthesis Example 1 were pre-mixed in 1500 parts by mass of a fluorine-containing solvent. Then, the fluorine-containing solvent was evaporated at 60° C. and the residue was kneaded using an open roll mill. Thereby, a fluorine-containing elastomer composition was obtained. The fluorine-containing elastomer was Dai-El Perfluoro GA-105 (Daikin Industries, Ltd.), which is a tetrafluoroethylene/perfluoroalkyl vinyl ether perfluoroelastomer. The fluorine-containing solvent used was R-318 (Daikin Industries, Ltd., main component: C$_4$F$_8$Cl$_2$).

The resulting fluorine-containing elastomer composition was press-molded at 85° C. for 10 minutes. The resulting molded article was subjected to the 50% mass reduction temperature measurement to be described later. The measurement result is shown in Table 2.

Example 5

A fluorine-containing elastomer composition was obtained in the same manner as in Example 4 except that the third generation-equivalent hyperbranched polymer obtained in Synthesis Example 1 was changed to the third generation-equivalent o-phenylenediamine-terminated hyperbranched polymer obtained in Synthesis Example 2. A molded article was obtained from the fluorine-containing elastomer composition in the same manner as in Example 4. The resulting molded article was subjected to the 50% mass reduction temperature measurement to be described later. The measurement result is shown in Table 2.

Example 6

A fluorine-containing elastomer composition was obtained in the same manner as in Example 4 except that the third generation-equivalent hyperbranched polymer obtained in Synthesis Example 1 was changed to the third generation-equivalent m-phenylenebis(trifluoroacetamide)-terminated hyperbranched polymer obtained in Synthesis Example 3. A molded article was obtained from the fluorine-containing elastomer composition in the same manner as in Example 4. The resulting molded article was subjected to the 50% mass reduction temperature measurement to be described later. The measurement result is shown in Table 2.

Comparative Example 2

A fluorine-containing elastomer composition was obtained in the same manner as in Example 4 except that the third generation-equivalent hyperbranched polymer obtained in Synthesis Example 1 was not used. A molded article was obtained from the fluorine-containing elastomer composition in the same manner as in Example 4. The resulting molded article was subjected to the 50% mass reduction temperature measurement to be described later. The measurement result is shown in Table 2.

(50% Mass Reduction Temperature)

The mass change was measured at an air of 200 ml/min and a heating rate of 10° C./min, and within a temperature range of 20° C. to 600° C. using a thermo-gravimetric analyzer (TG-DTA6200, Seiko Instruments Inc.) to determine the temperature at which the mass was reduced by 50%. The results are shown in Table 2.

TABLE 2

|  |  | Example 4 | Example 5 | Example 6 | Comparative Example 2 |
|---|---|---|---|---|---|
| Composition (parts by mass) | Fluorine-containing elastomer | 100 | 100 | 100 | 100 |
|  | m-Phenylenediamine-terminated hyperbranched polymer | 10 | 0 | 0 | 0 |
|  | o-Phenylenediamine-terminated hyperbranched polymer | 0 | 10 | 0 | 0 |

TABLE 2-continued

|  | Example 4 | Example 5 | Example 6 | Comparative Example 2 |
|---|---|---|---|---|
| m-Phenylenebis(trifluoroacetamide) hyperbranched polymer | 0 | 0 | 10 | 0 |
| 50% Mass reduction temperature (° C.) | 479 | 474 | 475 | 457 |

The invention claimed is:

1. A composition comprising:
a fluorine-containing polymer; and
a hyperbranched polymer of a cage silsesquioxane represented by the following formula (1):

[Chem. 1]

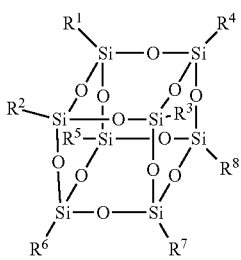

wherein $R^1$ to $R^8$ are each individually a hydrogen atom, a halogen atom, or an organic group, and at least one of $R^1$ to $R^8$ is an organic group.

2. The composition according to claim 1,
wherein the hyperbranched polymer of a cage silsesquioxane has a molecular weight distribution.

3. The composition according to claim 1,
wherein $R^1$ to $R^8$ in the formula (1) each individually contain a terminal group T represented by the following formula (2):

[Chem. 2]

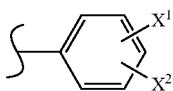

wherein $X^1$ and $X^2$ are each individually —$NH_2$, —OH, —SH, —H, —NH—CO—$CF_3$, or a group represented by the following formula:

[Chem. 3]

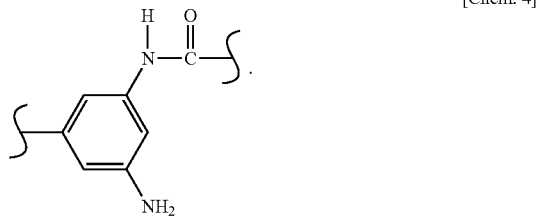

4. The composition according to claim 1,
wherein $R^1$ to $R^8$ in the formula (1) contain a divalent group B1 represented by the following formula (3-1):

[Chem. 4]

5. The composition according to claim 1,
wherein the fluorine-containing polymer is a fluorine-containing elastomer.

6. The composition according to claim 1,
wherein the composition contains 0.5 to 100 parts by mass of the hyperbranched polymer of a cage silsesquioxane relative to 100 parts by mass of the fluorine-containing polymer.

7. The composition according to claim 1, further comprising a cross-linking agent.

8. The composition according to claim 1,
wherein the composition is a molding material.

9. A molded article obtainable from the composition according to claim 1.

* * * * *